United States Patent
Esaka et al.

(10) Patent No.: US 11,041,887 B2
(45) Date of Patent: Jun. 22, 2021

(54) CURRENT SENSOR

(71) Applicant: DENSO CORPORATION, Kariya (JP)

(72) Inventors: Takuma Esaka, Kariya (JP); Kohsuke Nomura, Kariya (JP); Ryosuke Sakai, Kariya (JP); Tatsuaki Sugito, Kariya (JP)

(73) Assignee: DENSO CORPORATION, Kariya (JP)

( * ) Notice: Subject to any disclaimer, the term of this patent is extended or adjusted under 35 U.S.C. 154(b) by 119 days.

(21) Appl. No.: 16/425,056

(22) Filed: May 29, 2019

(65) Prior Publication Data

US 2019/0277890 A1 Sep. 12, 2019

Related U.S. Application Data

(63) Continuation of application No. PCT/JP2017/038657, filed on Oct. 26, 2017.

(30) Foreign Application Priority Data

Dec. 12, 2016 (JP) .............................. JP2016-240591

(51) Int. Cl.
  *G01R 15/20* (2006.01)
  *G01R 19/00* (2006.01)
  *G01R 33/02* (2006.01)

(52) U.S. Cl.
  CPC ........... *G01R 15/207* (2013.01); *G01R 15/20* (2013.01); *G01R 19/00* (2013.01); *G01R 33/02* (2013.01)

(58) Field of Classification Search
  CPC .... G01R 15/207; G01R 15/20; G01R 15/202; G01R 19/0092; G01R 33/07; G01R 33/017
  See application file for complete search history.

(56) References Cited

U.S. PATENT DOCUMENTS

| | | | | |
|---|---|---|---|---|
| 9,465,054 | B2* | 10/2016 | Sakamoto | G01R 15/207 |
| 2015/0260762 | A1* | 9/2015 | Sakamoto | G01R 1/18 |
| | | | | 324/117 R |
| 2016/0258985 | A1 | 9/2016 | Nomura et al. | |
| 2017/0082659 | A1* | 3/2017 | Harada | G01R 15/20 |
| 2017/0131329 | A1* | 5/2017 | Gorai | G01R 15/207 |
| 2017/0219634 | A1* | 8/2017 | Shimizu | G01R 15/205 |

FOREIGN PATENT DOCUMENTS

| | | |
|---|---|---|
| JP | 2017-072467 A | 4/2017 |
| JP | 2017-227617 A | 12/2017 |

* cited by examiner

*Primary Examiner* — Tung X Nguyen
*Assistant Examiner* — Feba Pothen
(74) *Attorney, Agent, or Firm* — Posz Law Group, PLC

(57) ABSTRACT

A current sensor, which is configured to individually detect a current flowing in each of at least two current paths, includes at least two phases. Each phase includes a magnetic field detection element and a pair of first magnetic shield and second magnetic shield. The magnetic field detection element is disposed to face one of the current paths. The magnetic field detection element is configured to detect a magnetic field generated from the one of the current paths and to convert the detected magnetic field into an electric signal. The first magnetic shield and the second magnetic shield are disposed to face each other with the current path and the magnetic field detection element interposed between the first magnetic shield and the second magnetic shield. The first magnetic shield and the second magnetic shield are configured to shield the magnetic field detection element from an external magnetic field.

7 Claims, 5 Drawing Sheets

CURRENT SENSOR

CROSS REFERENCE TO RELATED APPLICATIONS

The present application is a continuation application of International Patent Application No. PCT/JP2017/038657 filed on Oct. 26, 2017, which designated the U.S. and claims the benefit of priority from Japanese Patent Application No. 2016-240591 filed on Dec. 12, 2016. The entire disclosures of all of the above applications are incorporated herein by reference.

TECHNICAL FIELD

The present disclosure relates to a current sensor that detects a magnetic field generated from a current path, and converts the detected magnetic field into an electric signal, thereby to detect a current flowing in the current path.

BACKGROUND

As an example of a current sensor, there is a current detection system having three pairs of magnetic plates, and three bus bars and three semiconductor substrates, which are correspondingly provided for the three pairs of magnetic plates. The semiconductor substrate is provided with a magnetoelectric conversion element for converting a magnetic flux into an electric signal.

SUMMARY

The present disclosure describes a current sensor that is configured to individually detect a current flowing in each of at least two current paths. The current sensor includes at least two phases, each phase having a magnetic field detection element and a pair of magnetic shields including a first magnetic shield and a second magnetic shield. The magnetic field detection element is disposed to face one of the current paths. The magnetic field detection element is configured to detect a magnetic field generated from the one of the current paths and to convert the detected magnetic field into an electric signal. The first magnetic shield and the second magnetic shield are disposed to face each other with the current path and the magnetic field detection element interposed between the first magnetic shield and the second magnetic shield. The first magnetic shield and the second magnetic shield are configured to shield the magnetic field detection element from an external magnetic field.

BRIEF DESCRIPTION OF DRAWINGS

The above and other objects, features and advantages of the present disclosure will become more apparent from the following detailed description made with reference to the accompanying drawings, in which.

DETAILED DESCRIPTION

Figure 1:
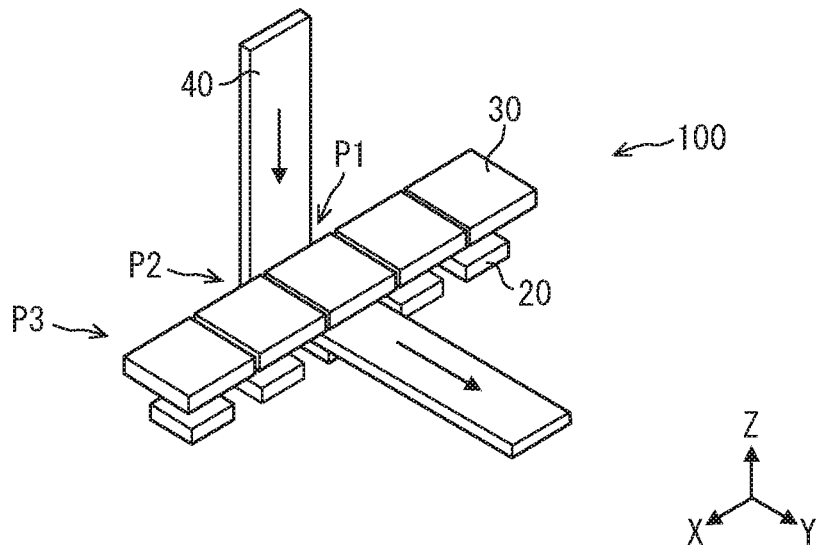
FIG. 1 is a perspective view showing a schematic configuration of a current sensor according to a first embodiment.

For example, there is a current detection system having three pairs of magnetic plates, and three bus bars and three semiconductor substrates, which are correspondingly provided for the three pairs of magnetic plates. The semiconductor substrate is provided with a magnetoelectric conversion element for converting a magnetic flux into an electric signal. The three pairs of magnetic plates (hereinafter, magnetic shields) are disposed adjacent to each other. The bus bar and the semiconductor substrate are disposed between magnetic shields of each pair facing each other. Further, adjacent magnetic shields are separated from each other. One pair of the magnetic plates, and the bus bar and the semiconductor substrate disposed between the one pair of magnetic plates are also referred to as a phase. Therefore, the current detection system has three phases disposed adjacent to each other.

In the current detection system configured as described above, when a relatively large current such as 1200 A is conducted to the bus bar of one phase, a magnetic field is generated from the bus bar. The magnetic field is concentrated inside the magnetic shield facing the bus bar, and propagates to the magnetic shield of an adjacent phase. However, a part of the magnetic field directed to the magnetic shield of the adjacent phase may leak from an inter-shield gap defined between the magnetic shield of the one phase and the magnetic shield of the adjacent shield. In other words, in the current detection system, a leakage magnetic field may be generated from a gap between the magnetic shield of the one phase and the magnetic shield of the adjacent phase. For that reason, in the current detection system, if the leakage magnetic field is generated, the magnetoelectric conversion element of the adjacent phase may sense the leakage magnetic field, resulting in a current detection error.

According to a first aspect of the present disclosure, a current sensor is configured to individually detect a current flowing in each of at least two current paths. The current sensor includes at least two phases, each phase having a magnetic field detection element, and a pair of magnetic shields. The magnetic field detection element is to be disposed to face one of the current paths, and is configured to detect a magnetic field generated from the one of the current paths and convert the detected magnetic field into an electric signal. The pair of magnetic shields includes a first magnetic shield and a second magnetic shield. The first magnetic shield and the second magnetic shield are disposed to face each other with the one of the current paths and the magnetic field detection element interposed between the first magnetic shield and the second magnetic shield. The first magnetic shield and the second magnetic shield are configured to shield the magnetic field detection element from an external magnetic field. Each of the phases is disposed such that the first magnetic shield, the current path, the magnetic field detection element, and the second magnetic shield are stacked on one another in a stated order in a stacking direction. The at least two phases are aligned in an alignment direction orthogonal to the stacking direction. A first gap is provided between the first magnetic shields of the adjacent phases, and a second gap is provided between the second magnetic shields of the adjacent phases. At least one of the first gap and the second gap is adjusted to cause a leakage magnetic field directing toward the magnetic field detection element from the first gap and a leakage magnetic field directing toward the magnetic field detection element from the second gap to cancel out each other in order to restrain both the leakage magnetic fields from arriving at the magnetic field detection element.

In this manner, at least one of the first gap and the second gap is adjusted so as to cause the leakage magnetic field directing toward the magnetic field detection element from the first gap and the leakage magnetic field directing toward the magnetic field detection element from the second gap to cancel out each other for the purpose of restraining both the leakage magnetic fields from arriving at the magnetic field detection element. For that reason, even when the leakage magnetic fields are generated from the first gap and the second gap toward the magnetic field detection element, it is less likely that the magnetic field detection element will sense the leakage magnetic field. Accordingly, the current sensor can detect the current with high accuracy.

According to a second aspect of the present disclosure, the current sensor according to the first aspect includes at least three phases. In the at least three phases, the two phases and an intermediate phase disposed between the two phases are arranged in an alignment direction orthogonal to the stacking direction, and at least one of the first gap and the second gap is adjusted so that a leakage magnetic field from the first gap toward the magnetic field detection element of the intermediate phase and a leakage magnetic field from the second gap toward the magnetic field detection element of the intermediate phase are canceled at the position of the magnetic field detection element of the intermediate phase.

As described above, at least one of the first gap and the second gap is adjusted so that the leakage magnetic field from the first gap toward the magnetic field detection element and the leakage magnetic field from the second gap toward the magnetic field detection element are cancelled out at the position of the magnetic field detection element of the intermediate phase. For that reason, even when the leakage magnetic fields are generated from the first gap and the second gap toward the magnetic field detection element of the intermediate phase, it is less likely that the magnetic field detection element of the intermediate phase will sense the leakage magnetic field. Accordingly, the current sensor can detect the current with high accuracy.

According to a third aspect of the present disclosure, a current sensor is configured to individually detect a current flowing in each of at least three current paths. The current sensor includes at least three phases, each phase having: a magnetic field detection element and a pair of magnetic shields. The magnetic field detection element is disposed to face one of the current paths, and is configured to detect a magnetic field generated from the one of the current paths and convert the detected magnetic field into an electric signal. The pair of magnetic shields includes a first magnetic shield and a second magnetic shield. The first magnetic shield and the second magnetic shield are disposed to face each other with the one of the current paths and the magnetic field detection element interposed between the first magnetic shield and the second magnetic shield. The first magnetic shield and the second magnetic shield are configured to shield the magnetic field detection element from an external magnetic field. Each of the phases is disposed such that the first magnetic shield, the current path, the magnetic field detection element, and the second magnetic shield are stacked on one another in a stated order in a stacking direction. The at least three phases are aligned in an alignment direction orthogonal to the stacking direction such that two of the phases and an intermediate phase between the two phases are aligned in the alignment direction. A first gap is provided between the first magnetic shields of the adjacent phases, and a second gap is provided between the second magnetic shields of the adjacent phases. At least one of a distance between the magnetic field detection element of the intermediate phase and the first magnetic shield of the adjacent phase, and a distance between the magnetic field detection element of the intermediate phase and the second magnetic shield of the adjacent phase is adjusted so that a leakage magnetic field from the first gap toward the magnetic field detection element of the intermediate phase and a leakage magnetic field from the second gap toward the magnetic field detection element of the intermediate phase are cancelled out at a position of the magnetic field detection element of the intermediate phase.

In this manner, the magnetic shields of the phases are provided such that the leakage magnetic field from the first gap toward the magnetic field detection element and the leakage magnetic field from the second gap toward the magnetic field detection element are cancelled out at the position of the magnetic field detection element of the intermediate phase. Specifically, at least one of the distance between the magnetic field detection element of the intermediate phase and the first magnetic shield of the adjacent phase, which will generate the leakage magnetic field, and the distance between the magnetic field detection element of the intermediate phase and the second magnetic shield of the adjacent phase, which will generate the leakage magnetic field, is adjusted. For that reason, even when the leakage magnetic fields are generated from the first gap and the second gap toward the magnetic field detection element of the intermediate phase, since the leakage magnetic fields can be restrained from being sensed by the magnetic field detection element of the intermediate phase, the current can be detected with high accuracy.

Embodiments of the present disclosure will be hereinafter further described with reference to the drawings. In each embodiment, portions corresponding to those described in the preceding embodiment are denoted by the same reference numerals, and a repetitive description may be omitted in some cases. In each embodiment, when only a part of the configuration is described, the other parts of the configuration can be applied with reference to the other preceding embodiments.

In the following description, three directions orthogonal to each other are referred to as an X-direction, a Y-direction, and a Z-direction. A plane defined by the X-direction and the Y-direction is denoted as an XY-plane, a plane defined by the X-direction and the Z-direction is denoted as an XZ-plane, and a plane defined by the Y-direction and the Z-direction is denoted as a YZ-plane.

First Embodiment

A current sensor 100 according to the present embodiment will be described with reference to FIGS. 1, 2, and 3. The current sensor 100 is mounted on a vehicle together with, for example, an inverter for converting a DC power into three-phase AC power, and a motor generator driven by a three-phase AC power from the inverter. The current sensor 100 detects a current flowing between the inverter and the motor generator. More specifically, the current sensor 100 individually detects currents flowing through three bus bars 40 electrically connecting the inverter and the motor generator. The current sensor 100 may be formed of, for example, a coreless current sensor that does not require a magnetism collecting core.

As will be described later, the current sensor 100 includes three phases P1 to P3. The phases P1 to P3 are provided correspondingly to the phases between the inverter and the motor generator. Each of the bus bars 40 corresponds to a current path. The current flowing through the bus bar 40 can also be referred to as a current to be detected.

Further, the inverter converts a DC power boosted by a boosting circuit into a three-phase AC power, and supplies the converted three-phase AC power to the motor generator. The current sensor 100 may have a configuration for detecting a current flowing between the boosting circuit and the inverter, in addition to a configuration for detecting a current for three phases. In the present embodiment, as shown in FIG. 1, a current sensor 100 including further two phases in addition to the three phases P1 to P3 is employed. However, the present embodiment may include three phases P1 to P3 at least. Therefore, the three phases P1 to P3 will be mainly described below. For that reason, in FIGS. 2 and 3, only the three phases P1 to P3 in the current sensor 100 are illustrated. In FIG. 1, the bus bar 40 is shown only in the first phase P1.

According to the present embodiment, as an example, the bus bar 40 including a first end portion 41, a second end portion 43, and an intermediate portion 42 disposed between the first end portion 41 and the second end portion 43 is employed. The bus bar 40 has, for example, a shape in which a plate-shape conductive member is bent. In the bus bar 40, for example, the first end portion 41 is an end on the motor generator side, and the second end portion 43 is an end on the inverter side. The intermediate portion 42 is a portion between the first end portion 41 and the second end portion 43, and is a portion interposed between the first magnetic shield 20 and the second magnetic shield 30, which will be described later. However, the configuration of the bus bar 40 is not limited to the above example.

Figure 2:
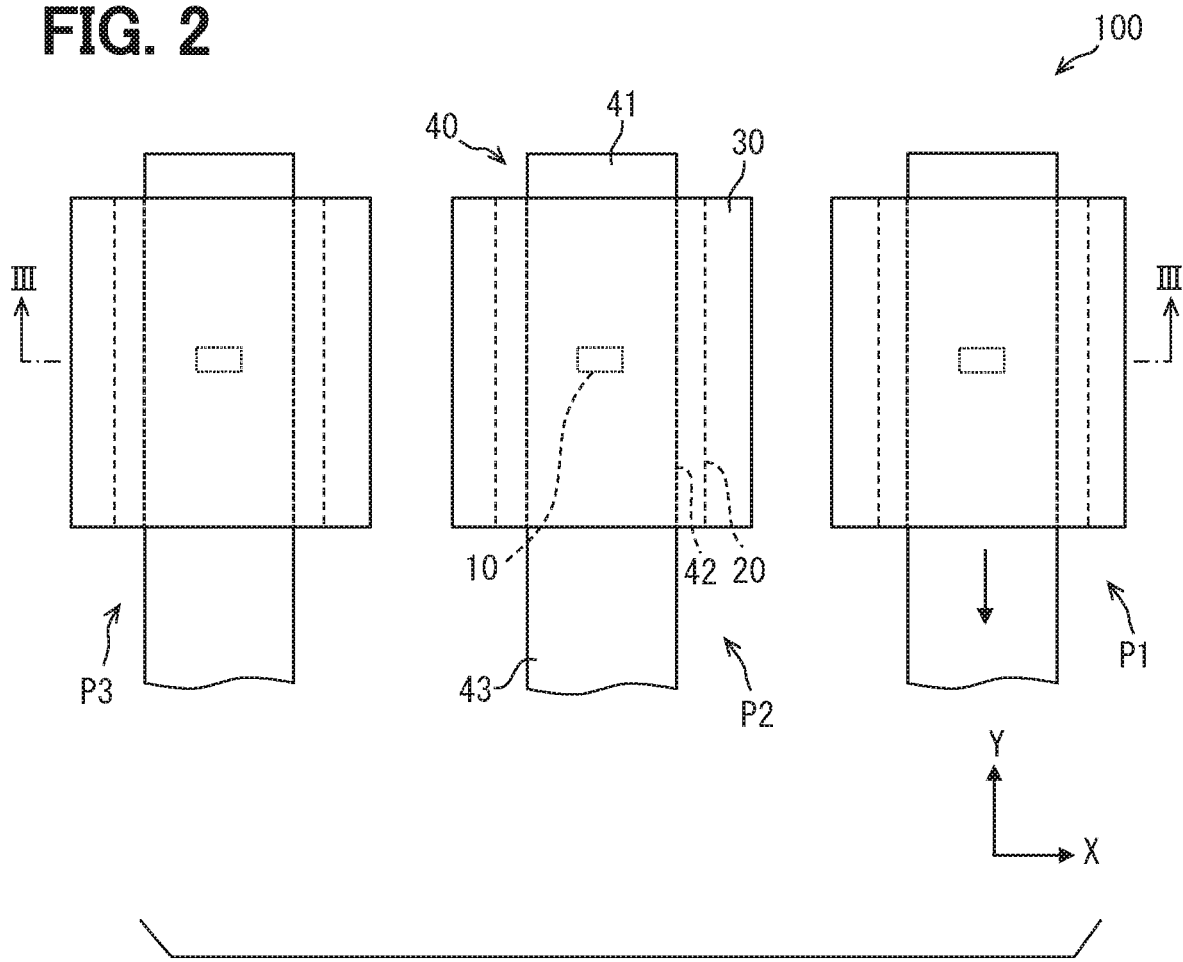
FIG. 2 is a plan view showing a schematic configuration of the current sensor according to the first embodiment.
Figure 3:
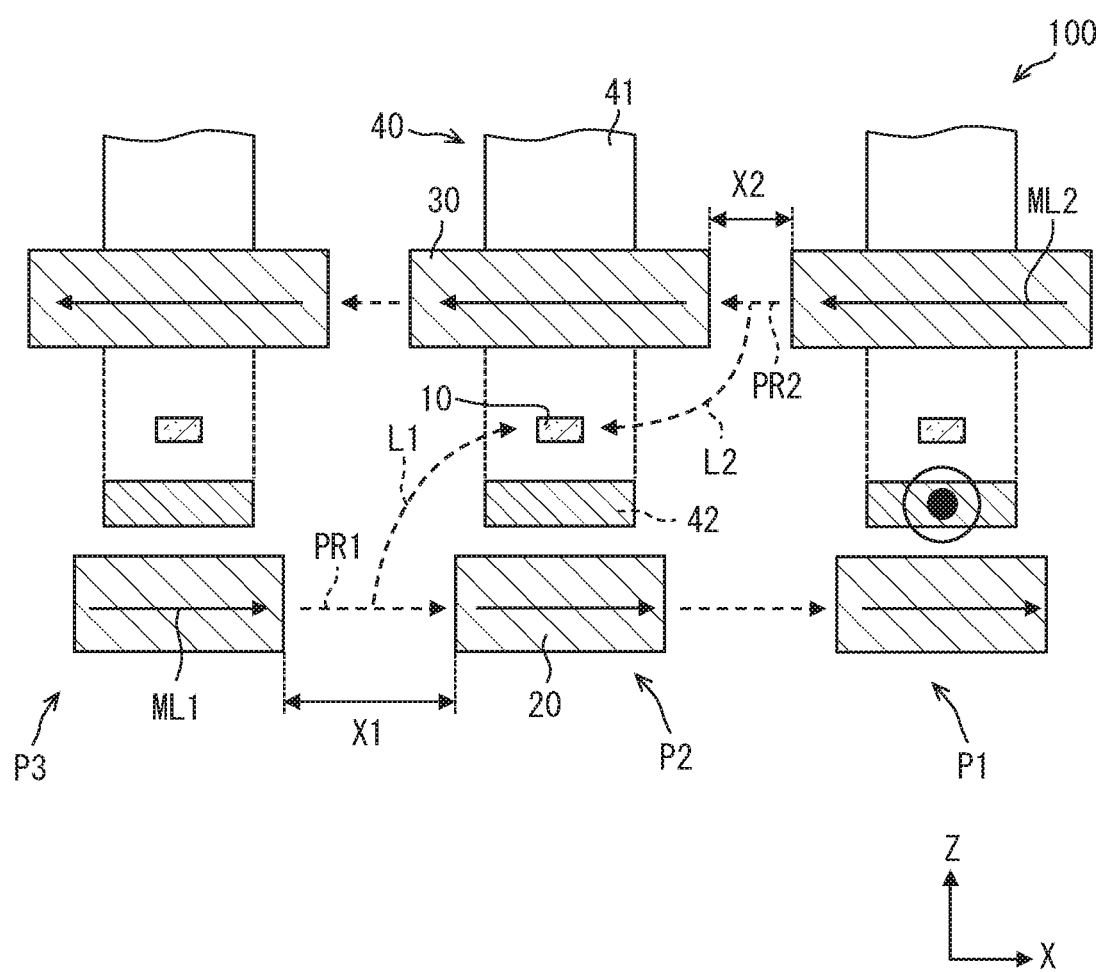
FIG. 3 is a cross-sectional view taken along a line III-III of FIG. 2.

As shown in FIGS. 1 to 3, the current sensor 100 includes the first phase P1, the second phase P2, and the third phase P3. The three phases P1 to P3 have the same configuration. For that reason, the second phase P2 will be described as an example.

The second phase P2 includes a magnetic field detection element 10 which is disposed to face one bus bar 40. The magnetic field detection element 10 detects a magnetic field generated from the bus bar 40, and converts the detected magnetic field into an electric signal. The second phase P2 includes a pair of magnetic shields, such as a first magnetic shield 20 and a second magnetic shield 30. The first magnetic shield 20 and the second magnetic shield 30 are disposed to face each other while interposing the bus bar 40 and the magnetic field detection element 10 between the first magnetic shield 20 and the second magnetic shield 30 in order to shield the magnetic field detection element 10 from an external magnetic field. The bus bar 40 including the intermediate portion 42, which is interposed between the first magnetic shield 20 and the second magnetic shield 30, of the second phase P2 can be regarded as the bus bar 40 as a detection target of the second phase P2.

The magnetic field detection element 10 can adopt a configuration in which, for example, a substrate having a sensor chip, a bias magnet, and a circuit chip thereon is sealed with a sealing resin body together with the components, and a lead connected to the circuit chip is exposed to the outside of the sealing resin body. As the sensor chip, for example, a giant magnetoresistance element (GMR), an anisotropic magnetoresistance element (AMR), a tunneling magnetoresistance element (TMR), a Hall element, or the like can be employed.

Each of the magnetic shields 20 and 30 is made of a magnetic material, and is used to restrain the transmission of an external magnetic field through the magnetic field detection element 10. Each of the magnetic shields 20 and 30 is formed of a stack of plate-shaped magnetic materials, for example. Therefore, as shown in FIGS. 1 and 2, each of the magnetic shields 20 and 30 is a plate-like member, and has, for example, a rectangular shape in each of the XY-plane, the YZ-plane, and the XZ-plane. As shown in FIGS. 2 and 3, each of the magnetic shields 20 and 30 is large enough to cover a facing area of the magnetic field detection element 10 and a facing area of the intermediate portion 42.

In the first magnetic shield 20, a facing surface which faces the intermediate portion 42 (hereinafter, referred to as a first facing surface) is provided in parallel with the XY-plane. Similarly, in the second magnetic shield 30, a facing surface which faces the magnetic field detection element 10 (hereinafter, referred to as a second facing surface) is provided in parallel with the XY-plane. The first facing surface is a surface on the side facing the second magnetic shield 30. The second facing surface is a surface on the side facing the first magnetic shield 20.

The first magnetic shield 20 and the second magnetic shield 30 are disposed to face each other across a space in the Z-direction. The first magnetic shield 20 and the second magnetic shield 30 are arranged in the Z-direction, between which the magnetic field detection element 10 and the bus bar 40 (the intermediate portion 42) are interposed. Therefore, the magnetic field detection element 10 and the intermediate portion 42 are disposed in the facing area of the first magnetic shield 20 and the facing area of the second magnetic shield 30. Since the first magnetic shield 20 and the second magnetic shield 30 are disposed parallel to each other, these magnetic shields can also be referred to as parallel flat plate shields.

As described above, the current sensor 100 has a configuration in which the first magnetic shields 20 are divided for the respective phases P1 to P3, and the second magnetic shields 30 are divided for the respective phases P1 to P3. However, the first magnetic shields 20 may be integrated with each other through a material, such as a resin, that does not have a function of magnetic shield. Likewise, the second magnetic shields 30 may be integrated with each other through a material, such as a resin, that does not have a function of magnetic shield.

In the second phase P2, as shown in FIG. 3, the first magnetic shield 20, the intermediate portion 42 of the bus bar 40, the magnetic field detection element 10, and the second magnetic shield 30 are stacked on one another in the stated order. In other words, in the second phase P2, these components are stacked on one another in the Z-direction.

As shown in FIGS. 1 to 3, the first magnetic shield 20 and the second magnetic shield 30 are different in size from each other. More specifically, the first magnetic shield 20 and the second magnetic shield 30 are different in size in the X-direction, that is, length in the X-direction from each other. This size difference is provided so as to adjust a distance between the adjacent first magnetic shields 20 and a distance between the adjacent second magnetic shields 30. In the present embodiment, an example is adopted in which the length of the first magnetic shield 20 in the X-direction is shorter than that of the second magnetic shield 30. The distance between the adjacent first magnetic shields 20 corresponds to a first gap X1, which will be described later. On the other hand, the distance between the adjacent second magnetic shields 30 corresponds to a second gap X2, which will be described later.

The three phases P1 to P3 configured as described above are aligned side by side in the X-direction as shown in FIGS. 1 to 3. The X-direction corresponds to a direction orthogonal to the stacking direction. In other words, the phases P1 to P3 are aligned so that directions in which the current flows in the intermediate portions 42 (Y-direction) are parallel to each other. The phases P1 to P3 are spaced from each other, between the phases adjacent to each other. In the following description, the phases adjacent to each other will also be referred to as adjacent phases.

In the present embodiment, an example is employed in which the first phase P1, the second phase P2, and the third phase P3 are aligned in a stated order in the X-direction. Therefore, the second phase P2 corresponds to an intermediate phase located between the first phase P1 and the third phase P3. The second phase P2 is an adjacent phase relative to the first phase P1 and an adjacent phase relative to the third phase P3. In other words, the first phase P1 and the third phase P3 are not adjacent to each other. The first magnetic shield 20 of the intermediate phase corresponds to a first intermediate shield. The second magnetic shield 30 of the intermediate phase corresponds to a second intermediate shield.

The magnetic field detection elements 10 are aligned side by side in the X-direction. The first magnetic shields 20 are aligned side by side in the X-direction. Similarly, the second magnetic shields 30 are aligned side by side in the X-direction. The intermediate portions of the bus bars 40 of the respective phases P1 to P3 are also aligned side by side in the X-direction.

The first facing surfaces of the first magnetic shields 20 are located on the same virtual plane parallel to the XY-plane. Similarly, the second facing surfaces of the second magnetic shields 30 are located on the same virtual plane parallel to the XY-plane. The position of the virtual plane on which the first facing surfaces are located is different in the Z-direction from the position of the virtual plane on which the second facing surfaces are located.

The positions of the first magnetic shields 20 in the X-direction are different from each other, but the positions of the first magnetic shields 20 in each of the Y-direction and the Z-direction are the same as each other. Similarly, the positions of the second magnetic shields 30 in the X-direction are different from each other, but the positions of the second magnetic shields 30 in each of the Y-direction and the Z-direction are the same as each other.

In each of the phases P1 to P3, as shown in FIG. 3, the first gap X1 is provided between the first magnetic shields 20 of the adjacent phases, and the second gap X2 is provided between the second magnetic shields 30 of the adjacent phases. That is, for example, the first gap X1 is provided between the first magnetic shield 20 of the third phase P3 and the first magnetic shield 20 of the second phase P2. The second gap X2 is provided between the second magnetic shield 30 of the first phase P1 and the second magnetic shield 30 of the second phase P2.

The first gap X1 can be regarded as the shortest distance between the adjacent first magnetic shields 20 in the X-direction. On the other hand, the second gap X2 can be regarded as the shortest distance between adjacent second magnetic shields 30 in the X-direction. The first gap X1 and the second gap X2 are adjusted to reduce an influence of a leakage magnetic field on the magnetic field detection elements 10. The adjustment of the first gap X1 and the second gap X2 will be described later.

In the current sensor 100, for example, the phases P1 to P3 are integrated with each other through a circuit board or a housing. Further, in the current sensor 100, in addition to the phases P1 to P3, the bus bars 40 may be integrated with each other through the circuit board or the housing. The structure integrated in this manner can also be referred to as a sensor terminal block. The sensor terminal block may also integrally include the further two phases different from the phases P1 to P3 shown in FIG. 1 and the bus bars 40 provided corresponding to the two phases. The circuit board is electrically connected to each of the magnetic field detection elements 10, and receives a sensor signal from each of the magnetic field detection elements 10.

In the current sensor 100 configured as described above, a relatively large current such as 1200 A flows in the bus bar 40 which is a detection target of a certain phase. In this situation, the current flowing in the bus bar 40 of the phase adjacent to the certain phase is detected as a detection target current. The bus bar 40 through which the relatively large current flows can cause a noise generation source. For that reason, the phase having the bus bar 40 causing the noise generation source as a target to be detected can be referred to as a noise phase. On the other hand, the phase for detecting the current to be detected as the detection target current can be referred to as a detection phase. In the present embodiment, as shown in FIG. 3, a situation in which the first phase P1 is the noise phase and the second phase P2 is the detection phase is exemplified.

The magnetic field generated from the bus bar 40 of the noise phase runs concentrically according to the law of the right-hand thread of Ampere. The magnetic field is concentrated inside the first magnetic shield 20 and the second magnetic shield 30 which are disposed to oppose the bus bar 40. As shown in FIG. 3, magnetic lines of force ML1 and ML2 occur in directions indicated by solid arrows in the first magnetic shield 20 and the second magnetic shield 30. The magnetic line of force ML1 in the first magnetic shield 20 and the magnetic line of force ML2 in the second magnetic shield 30 have opposite vectors.

In the current sensor 100, a magnetic field PR2 propagates from the second magnetic shield 30 of the first phase P1 to the second magnetic shield 30 of the second phase P2, and from the second magnetic shield 30 of the second phase P2 to the second magnetic shield 30 of the third phase P3. Similarly, in the current sensor 100, a magnetic field PR1 propagates from the first magnetic shield 20 of the third phase P3 to the first magnetic shield 20 of the second phase P2, and from the first magnetic shield 20 of the second phase P2 to the first magnetic shield 20 of the first phase P1.

The magnetic fields PR1 and PR2 directing toward the magnetic shield of the adjacent phase may partially leak from a gap between the magnetic shields of the adjacent phase. In the present embodiment, as shown in FIG. 3, an example is employed in which a leakage magnetic field L2 occurs from the second gap X2 between the second magnetic shields 30 and a leakage magnetic field L1 occurs from the first gap X1 between the first magnetic shields 20. When the leakage magnetic fields L1 and L2 direct toward the magnetic field detection element 10 of the second phase P2, and transmit through the magnetic field detection element 10, the leakage magnetic fields L1 and L2 may affect a magnetoelectric conversion result of the magnetic field detection element 10.

The vectors of the leakage magnetic fields PR1 and PR2 are inverse vectors at the position of the magnetic field detection element 10 of the intermediate phase. Thus, in the current sensor 100, at least one of the first gap X1 and the second gap X2 are adjusted so that the leakage magnetic field L1 and the leakage magnetic field L2 are cancelled out at a position of the magnetic field detection element 10 of the intermediate phase. In other words, the current sensor 100 is configured such that the leakage magnetic field L1 from the first gap X1 toward the magnetic field detection element 10 of the intermediate phase and the leakage magnetic field L2 from the second gap X2 toward the magnetic field detection element 10 of the intermediate phase are cancelled out at the position of the magnetic field detection element 10 of the intermediate phase.

In each of the first gap X1 and the second gap X2, the amount of the leakage magnetic field increases as the gap becomes larger, and the amount of the leakage magnetic field decreases as the gap becomes smaller. In other words, in the current sensor 100, the amount of the leakage magnetic field is controlled by adjusting at least one of the first gap X1 and the second gap X2, so that the leakage magnetic field L1 and the leakage magnetic field L2 cancel out at the position of the magnetic field detection element 10 in the intermediate phase.

In the current sensor 100, the amount of the leakage magnetic field is controlled by adjusting at least one of the first gap X1 and the second gap X2, and thus the influence of the leakage magnetic field L1 and the leakage magnetic field L2 on the magnetic field detection element 10 of the intermediate phase is suppressed. Further, the current sensor 100 is configured such that the leakage magnetic field L1 and the leakage magnetic field L2 weaken each other at the position of the magnetic field detection element 10 of the intermediate phase.

In the present embodiment, as an example, the first gap X1 is adjusted to be larger than the second gap X2 by setting the length of the first magnetic shield 20 in the X-direction to be shorter than that of the second magnetic shield 30. Accordingly, in the present embodiment, the amount of leakage magnetic field L1 from the first gap X1 is increased more than the amount of leakage magnetic field L2 from the second gap X2, so that both the leakage magnetic fields L1 and L2 are cancelled out at the position of the magnetic field detection element 10 of the intermediate phase. The first gap X1 and the second gap X2 can be set to have values such that the two leakage magnetic fields L1 and L2 are cancelled out at the position of the magnetic field detection element 10 of the intermediate phase by simulation, experiment, or the like.

As described above, in the current sensor 100, at least one of the first gap X1 and the second gap X2 is adjusted so that the leakage magnetic field L1 and the leakage magnetic field L2 are cancelled out at the position of the magnetic field detection element 10 of the intermediate phase. For that reason, even when the leakage magnetic fields L1 and L2 occur from the first gap X1 and the second gap X2 toward the magnetic field detection element 10 of the intermediate phase, the current sensor 100 can restrain the magnetic field detection element 10 of the intermediate phase from sensing the leakage magnetic fields L1 and L2. Therefore, the current sensor 100 can detect the current with high accuracy.

In addition, since the length of the first magnetic shield 20 in the X-direction is shortened, the current sensor 100 can detect the current with high accuracy while reducing the size of the body in the X-direction. For that reason, the sensor terminal block including the current sensor 100 can be expected to be reduced in size.

Further, in the current sensor 100, since the first gap X1 is adjusted to be larger than the second gap X2, electronic components such as a capacitor and a resistor can be easily arranged in the first gap X1. For that reason, the current sensor 100 can be reduced in size more than that in the case where the electronic components are disposed outside the first gap X1. Therefore, the sensor terminal block including the current sensor 100 can be expected to be reduced in size.

In the present embodiment, an example is adopted in which the length of the first magnetic shield 20 in the X-direction is shorter than that of the second magnetic shield 30. However, the present disclosure is not limited to the above configuration. According to the present disclosure, the length of the second magnetic shield 30 in the X-direction may be set to be shorter than that of the first magnetic shield 20 in accordance with a situation of the leakage magnetic field, so that the leakage magnetic fields L1 and L2 can be cancelled out at the position of the magnetic field detection element 10 in the intermediate phase.

Further, in the current sensor 100, an additional magnetic member having a magnetic permeability different from that of the first magnetic shield 20 may be provided at an end portion of the first magnetic shield 20 in the X-direction. In such a case, if a leakage magnetic field is developed between the first magnetic shield 20 and the additional magnetic member, the current sensor 100 can detect the current with high accuracy by adjusting the first gap X1.

In the present embodiment, an example is employed in which the first gap X1 is adjusted so that the leakage magnetic fields L1 and L2 are cancelled out each other. However, the present disclosure is not limited to the above configuration, and the advantages described above can be achieved if at least one of the first gap X1 and the second gap X2 is adjusted. Therefore, in the current sensor 100, only the second gap X2 may be adjusted, or both of the first gap X1 and the second gap X2 may be adjusted.

In this example, the first gap X1 is a gap between the first intermediate shield 20 and the first magnetic shield 20 of the adjacent phase which propagates the leakage magnetic field PR1 to the first intermediate shield 20. Similarly, the second gap X2 is a gap between the second intermediate shield 30 and the second magnetic shield 30 of the adjacent phase which propagates the leakage magnetic field PR2 to the second intermediate shield 30.

Hereinafter, as another embodiment of the present disclosure, a modification and a second embodiment will be described. The first embodiment described above, the modification, and the second embodiment can be implemented independently, or can be implemented in combination as appropriate.

(Modification)

Figure 4:
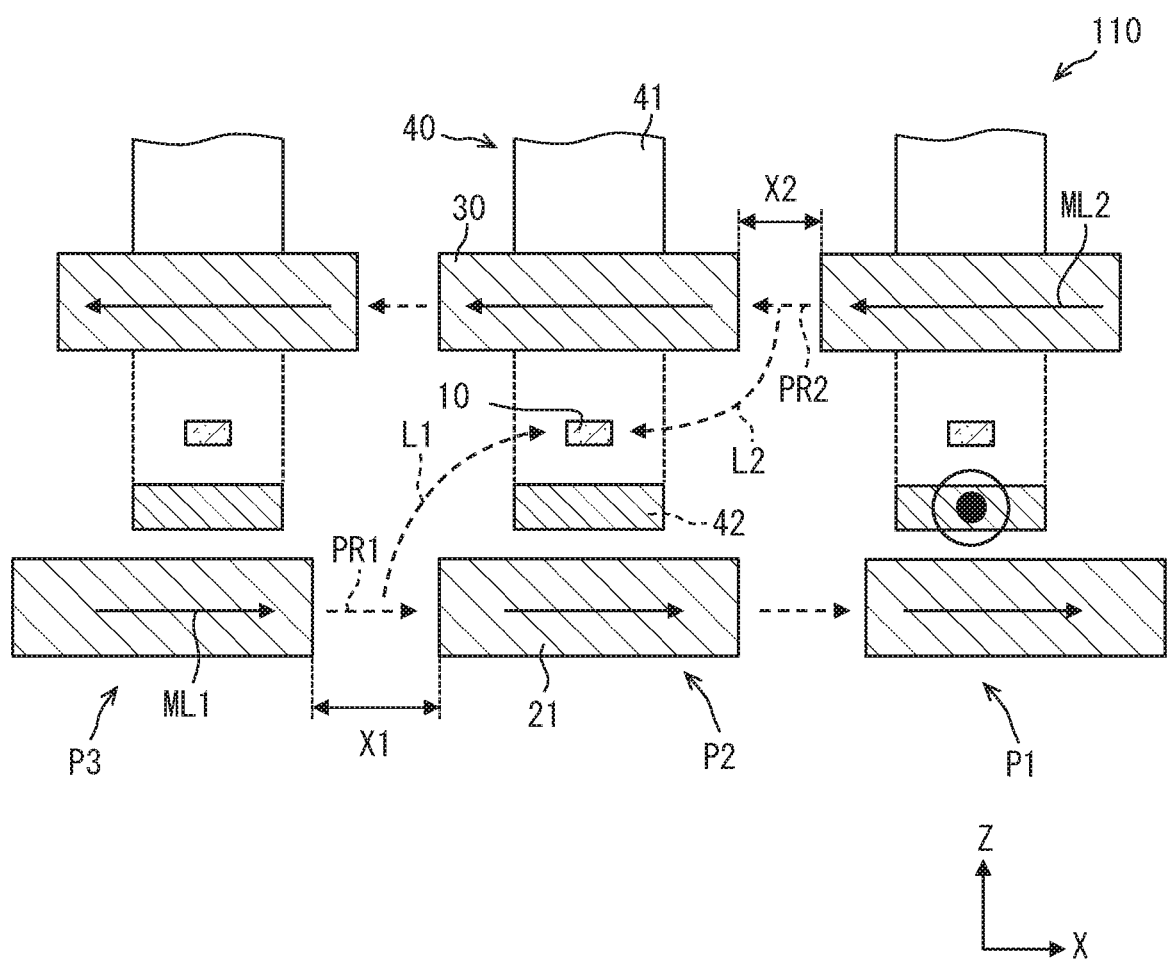
FIG. 4 is a cross-sectional view showing a schematic configuration of a current sensor according to a modification.

A current sensor 110 according to the modification will be described with reference to FIG. 4. A configuration of a first magnetic shield 21 of the current sensor 110 is different from that of the first magnetic shield 20 of the current sensor 100.

A length of the first magnetic shield 21 in the X-direction is equal to that of a second magnetic shield 30. In other words, in the current sensor 110, the first magnetic shield 21 has the same body size as that of the second magnetic shield 30.

In the current sensor 110, the first gap X1 is adjusted by the position of the first magnetic shield 21 in the X-direction. As a result, in the current sensor 110, the amount of leakage magnetic field L1 from the first gap X1 is increased to be larger than the amount of leakage magnetic field L2 from the second gap X2, so that both the leakage magnetic fields L1 and L2 can be cancelled out at the position of the magnetic field detection element 10 in the intermediate phase. Therefore, the current sensor 110 can exhibit the similar advantageous effects to those of the current sensor 100.

Further, since the current sensor 110 uses the first magnetic shield 21 and the second magnetic shield 30 having the same body size, the number of types of magnetic shields can be reduced as compared with the case where the first magnetic shield 21 and the second magnetic shield 30 having different body sizes are used. In other words, in the current sensor 100, two types of magnetic shields having the different body sizes are required as the first magnetic shield 20 and the second magnetic shield 30. On the other hand, in the current sensor 110, the first magnetic shield 21 and the second magnetic shield 30 can be configured by one type of magnetic shields having the same body size.

For that reason, the cost of the current sensor 110 can be expected to be reduced more than that of the current sensor 100. Further, the components of the current sensor 110 can be easily managed because the number of types of magnetic shields is smaller.

In addition, in the current sensor 110, the position of the second magnetic shield 30 in the X-direction may be adjusted in accordance with the situation of the leakage magnetic field so that the leakage magnetic fields L1 and L2 can be cancelled out at the position of the magnetic field detection element 10 in the intermediate phase. Further, in the current sensor 110, the positions of the first magnetic shield 21 and the second magnetic shield 30 in the X-direction may be adjusted so that the leakage magnetic fields L1 and L2 can be cancelled out at the position of the magnetic field detection element 10 in the intermediate phase.

Second Embodiment

Figure 5:
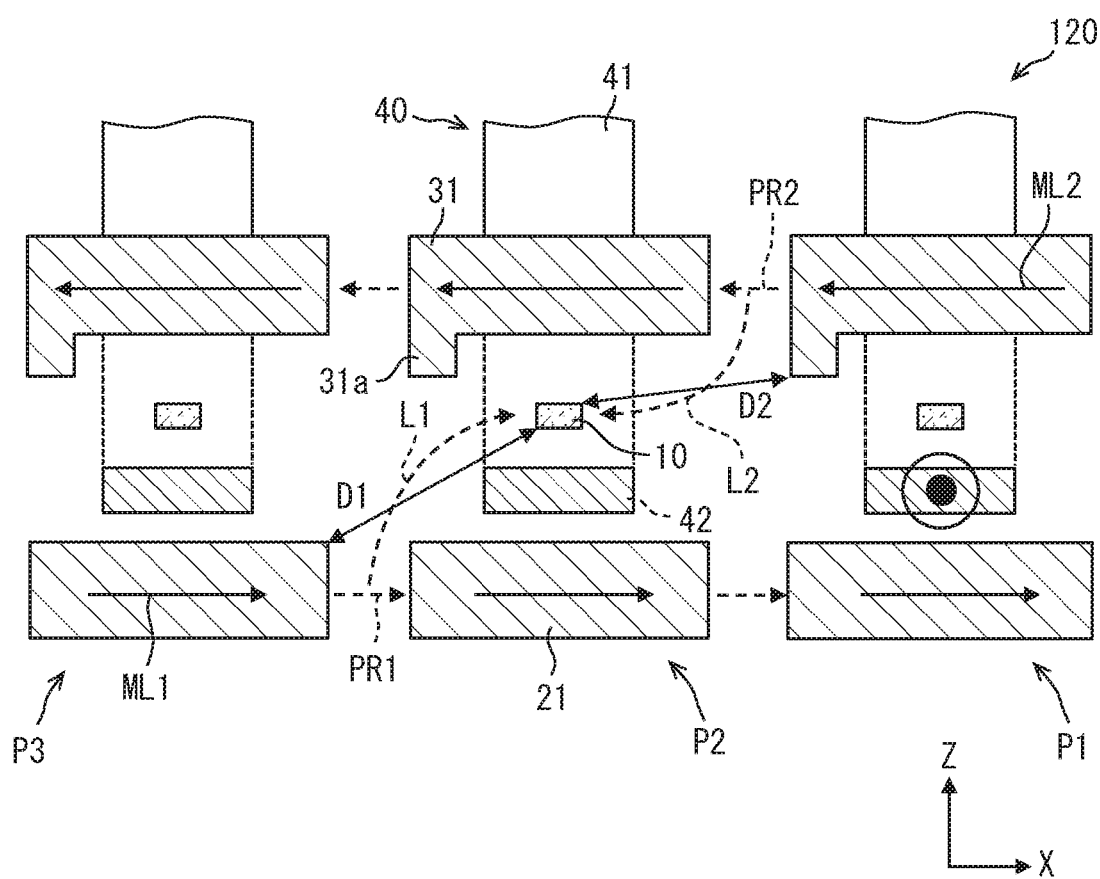
FIG. 5 is a cross-sectional view showing a schematic configuration of a current sensor according to a second embodiment.

A current sensor 120 according to a second embodiment will be described with reference to FIG. 5. A configuration of a second magnetic shield 31 of the current sensor 120 is different from that of the second magnetic shield 30 of the current sensor 110. The current sensor 120 is different from the current sensor 110 in that a gap between first magnetic shields 21 and a gap between second magnetic shields 31 are equal to each other.

The second magnetic shield 31 has a protrusion 31a. More specifically, the second magnetic shield 31 has a shape in which the protrusion 31a is provided on a main body portion having a configuration similar to that of the second magnetic shield 30. The protrusion 31a is made of a magnetic material similar to that of the second magnetic shield 30. The protrusion 31a is provided continuously in the Y-direction in the main body portion.

In the present embodiment, as an example, the protrusion 31a having a rectangular prism shape is employed. However, the present disclosure is not limited to the above configuration, and a cylindrical protrusion 31a or the like can also be employed.

The protrusion 31a is provided to shorten a distance D2 between the second magnetic shield 31 and the magnetic field detection element 10 of the intermediate phase. The distance D2 is shorter than a distance D1 between the first magnetic shield 21 and the magnetic field detection element 10 of the intermediate phase. In the second magnetic shield 31, when the protrusion 31a is not provided, the distance between the magnetic field detection element 10 of the intermediate phase and the second magnetic shield 31 is about the distance D1 between the first magnetic shield 21 and the magnetic field detection element 10 of the intermediate phase. In other words, in the present embodiment, an example is employed in which the distance D2 between the second magnetic shield 31 of the first phase P1 and the magnetic field detection element 10 of the second phase P2 is adjusted with respect to the distance D1 between the first magnetic shield 21 of the third phase P3 and the magnetic field detection element 10 of the second phase P2.

The distance D2 corresponds to the shortest distance between the second magnetic shield 31 and the magnetic field detection element 10 of the intermediate phase. Similarly, the distance D1 corresponds to the shortest distance between the first magnetic shield 21 and the magnetic field detection element 10 of the intermediate phase. The first magnetic shield 21 of the third phase P3 is a magnetic shield that develops a leakage magnetic field to the magnetic field detection element 10 of the intermediate phase. Similarly, the second magnetic shield 31 of the first phase P1 is a magnetic shield that develops a leakage magnetic field to the magnetic field detection element 10 of the intermediate phase.

The reason why the distance between the second magnetic shield 31 and the magnetic field detection element 10 of the intermediate phase is shortened in this manner is to cancel out the leakage magnetic fields L1 and L2 at the position of the magnetic field detection element 10 of the intermediate phase. In other words, the current sensor 120 is configured such that the leakage magnetic field L1 from the first gap toward the magnetic field detection element 10 of the intermediate phase and the leakage magnetic field L2 from the second gap toward the magnetic field detection element 10 in the intermediate phase are cancelled out at the position of the magnetic field detection element 10 of the intermediate phase.

For that reason, even when the leakage magnetic fields are generated from the first gap and the second gap toward the magnetic field detection element 10 in the intermediate phase, it is less likely that the current sensor 120 will sense the leakage magnetic field by the magnetic field detection element 10 in the intermediate phase. As such, the current sensor 120 can detect the current with high accuracy.

In the present embodiment, an example in which the protrusion 31a is provided only on the second magnetic shield 31 is employed. However, the present disclosure is not limited to the above configuration, but a protrusion may be provided only on the first magnetic shield 21, or a protrusion may be provided on each of the first magnetic shield 21 and the second magnetic shield 31. Therefore, according to the present disclosure, at least one of the distance between the magnetic field detection element 10 of the intermediate phase and the first magnetic shield 21 which develops the leakage magnetic field and the distance between the magnetic field detection element 10 of the intermediate phase and the second magnetic shield 31 which develops the leakage magnetic field may be adjusted.

Third Embodiment

Figure 6:
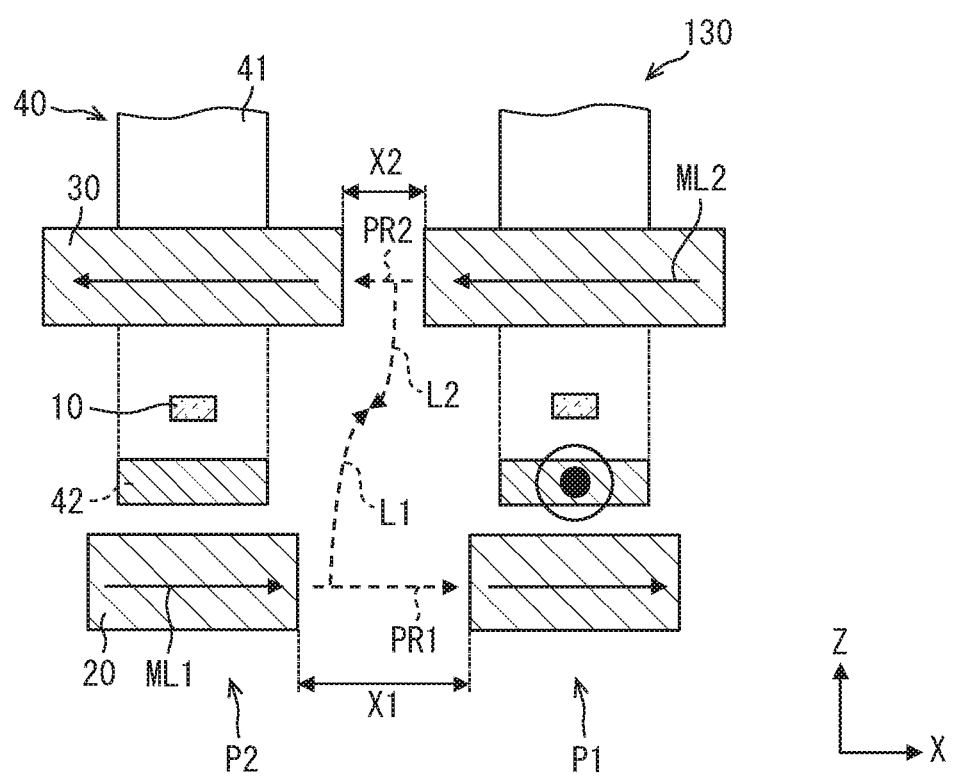
FIG. 6 is a cross-sectional view showing a schematic configuration of a current sensor according to a third embodiment.

A current sensor 130 according to a third embodiment will be described with reference to FIG. 6. The current sensor 130 is different in the number of phases from the current sensor 100. The current sensor 130 includes two phases of a first phase P1 and a second phase P2. The configuration of each phase is the same as that of the current sensor 100.

In the current sensor 130, in order to restrain a leakage magnetic field L1 and a leakage magnetic field L2 from reaching the magnetic field detection elements 10, at least one of a first gap X1 and a second gap X2 is adjusted so that both of the leakage magnetic fields are cancelled out each other. In the current sensor 130, the amount of the leakage magnetic field is controlled by adjusting at least one of the first gap X1 and the second gap X2, and an influence of both the leakage magnetic fields L1 and L2 on the magnetic field detection element 10 is reduced. In addition, in the current sensor 130, the amount of the leakage magnetic field is controlled by adjusting at least one of the first gap X1 and the second gap X2 so that the leakage magnetic field L1 and the leakage magnetic field L2 are cancelled out each other and both of the leakage magnetic fields L1 and L2 are weakened each other at a position of the magnetic field detection element 10. Further, the current sensor 130 is configured such that the leakage magnetic field L1 and the leakage magnetic field L2 do not reach the magnetic field detection element 10.

The current sensor 130 has the similar advantageous effects to those of the current sensor 100. The present embodiment can also be implemented in combination with the modification. In this case, the current sensor 130 can exhibit the similar advantageous effects to those of the current sensor 110.

While the present disclosure has been described with reference to embodiments thereof, it is to be understood that the disclosure is not limited to the embodiments and constructions. The present disclosure is intended to cover various modification and equivalent arrangements. In addition, while the various combinations and configurations, other combinations and configurations, including more, less or only a single element, are also within the spirit and scope of the present disclosure.

What is claimed is:

1. A current sensor for individually detecting a current flowing in each of at least two current paths, the current sensor comprising:
    at least two phases, each phase including:
        a magnetic field detection element that is to be disposed to face one of the current paths, and is configured to detect a magnetic field generated from the one of the current paths and convert the detected magnetic field into an electric signal; and
        a pair of first magnetic shield and second magnetic shield that is disposed to face each other with the one of the current paths and the magnetic field detection element interposed between the first magnetic shield and the second magnetic shield, and is configured to shield the magnetic field detection element from an external magnetic field, wherein
    each of the at least two phases is disposed such that the first magnetic shield, the one of the current paths, the magnetic field detection element, and the second magnetic shield are stacked on one another in a stacking direction,
    the at least two phases are aligned in an alignment direction orthogonal to the stacking direction of the first magnetic shield, the one of the current paths, the magnetic field detection element and the second magnetic shield,
    a first gap is provided between the first magnetic shields of the adjacent phases, and a second gap is provided between the second magnetic shields of the adjacent phases, and
    at least one of the first gap and the second gap is adjusted so that a leakage magnetic field directing toward the magnetic field detection element from the first gap and a leakage magnetic field directing toward the magnetic field detection element from the second gap are cancelled out by each other in order to restrain both the leakage magnetic fields from arriving at the magnetic field detection element.

2. The current sensor according to claim 1, wherein
    the at least two phases include at least three phases aligned in the alignment direction orthogonal to the stacking direction,
    at least one of the first gap and the second gap is adjusted so that a leakage magnetic field from the first gap toward the magnetic field detection element of an intermediate phase and a leakage magnetic field from the second gap toward the magnetic field detection element of the intermediate phase are cancelled out by each other at a position of the magnetic field detection element of the intermediate phase, the intermediate phase being one of the at least three phases located between other two of the at least three phases.

3. The current sensor according to claim 2, wherein
    the intermediate phase includes a first intermediate shield as the first magnetic shield and a second intermediate shield as the second magnetic shield,
    the first gap is a gap between the first intermediate shield and the first magnetic shield of the adjacent phase which propagates the leakage magnetic field to the first intermediate shield, and the second gap is a gap between the second intermediate shield and the second magnetic shield of the adjacent phase which propagates the leakage magnetic field to the intermediate second shield, and
    only one of the first gap and the second gap is adjusted.

4. The current sensor according to claim 2, wherein
    the at least two current paths are disposed between an inverter that converts a DC power into a three-phase AC power and a motor generator that is driven by the three-phase AC power from the inverter,
    the at least three phases are correspondingly provided for phases of current paths between the inverter and the motor generator, and configured to detect currents flowing in the respective current path between the inverter and the motor generator.

5. The current sensor according to claim 1, wherein
    the at least one of the first gap and the second gap is adjusted according to a length of at least one of the first magnetic shield and the second magnetic shield in the alignment direction of the at least two phases.

6. The current sensor according to claim 1, wherein
    the at least one of the first gap and the second gap is adjusted according to a position of at least one of the first magnetic shield and the second magnetic shield in the alignment direction of the at least two phases.

7. A current sensor for individually detecting a current flowing in each of at least three current paths, the current sensor comprising:
    at least three phases, each phase including:
        a magnetic field detection element that is disposed to face one of the current paths, and is configured to detect a magnetic field generated from the one of the current paths and convert the detected magnetic field into an electric signal; and
        a pair of first magnetic shield and second magnetic shield that is disposed to face each other with the one of the current paths and the magnetic field detection element interposed between the first magnetic shield and the second magnetic shield, and configured to shield the magnetic field detection element from an external magnetic field, wherein in each of the at least three phases, the first magnetic shield, the current path, the magnetic field detection element, and the second magnetic shield are stacked on one another in a stacking direction, in the at least three phases, two of the phases and an intermediate phase located between the two of the phases are aligned in an alignment direction orthogonal to the stacking direction of the first magnetic shield, the current path, the magnetic field detection element and the second magnetic shield, a first gap is provided between the first magnetic shields of the adjacent phases, and a second gap is provided between the second magnetic shields of the adjacent phases, and at least one of a distance between the magnetic field detection element of the intermediate phase and the first magnetic shield of the adjacent phase, and a distance between the magnetic field detection element of the intermediate phase and the second magnetic shield of the adjacent phase is adjusted so that a leakage magnetic field toward the magnetic field detection element of the intermediate phase from the first gap and a leakage magnetic field toward the magnetic field detection element of the intermediate phase from the second gap are cancelled out at a position of the magnetic field detection element of the intermediate phase.

* * * * *